(12) United States Patent
Nishio et al.

(10) Patent No.: US 7,768,867 B2
(45) Date of Patent: Aug. 3, 2010

(54) STACKED SEMICONDUCTOR DEVICE

(75) Inventors: Yoji Nishio, Tokyo (JP); Yutaka Uematsu, Tokyo (JP); Seiji Funaba, Tokyo (JP); Hideki Osaka, Tokyo (JP); Tsutomu Hara, Tokyo (JP); Koichiro Aoki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 363 days.

(21) Appl. No.: 11/761,470

(22) Filed: Jun. 12, 2007

(65) Prior Publication Data
US 2007/0291557 A1 Dec. 20, 2007

(30) Foreign Application Priority Data
Jun. 13, 2006 (JP) ............... 2006-163735

(51) Int. Cl.
*G11C 8/00* (2006.01)
(52) U.S. Cl. ............... 365/233.1; 365/193; 365/230.03; 365/63
(58) Field of Classification Search ............. 365/233.1, 365/193, 230.03, 63
See application file for complete search history.

(56) References Cited

U.S. PATENT DOCUMENTS

2003/0048691 A1* 3/2003 Maruyama et al. .......... 365/233
2005/0105318 A1* 5/2005 Funaba et al. ............... 365/63
2006/0233012 A1* 10/2006 Sekiguchi et al. ........... 365/51

FOREIGN PATENT DOCUMENTS

| JP | 11-202970 A | 7/1999 |
| JP | 2002-169721 A | 6/2002 |
| JP | 2004-158892 A | 6/2004 |
| JP | 2005-156328 A | 6/2005 |

* cited by examiner

*Primary Examiner*—Hoai V Ho
*Assistant Examiner*—Fernando N Hidalgo
(74) *Attorney, Agent, or Firm*—Sughrue Mion, PLLC

(57) ABSTRACT

Stacked semiconductor device includes plural memory chips, stacked together, in which waveform distortion at high speed transmission is removed. Stacked semiconductor device 1 includes plural memory chips 11, 12 stacked together. Data strobe signal (DQS) and inverted data strobe signal (/DQS), as control signals for inputting/outputting data twice per cycle, are used as two single-ended data strobe signals. Data strobe signal and inverted data strobe signal mate with each other. Data strobe signal line for the data strobe signal L4 is connected to data strobe signal (DQS) pad of first memory chip 11. Inverted data strobe signal line for /DQS signal L5 is connected to inverted data strobe signal (/DQS) pad of second memory chip 12.

11 Claims, 10 Drawing Sheets

(FIFTH EXAMPLE)

(FIRST EXAMPLE)

(FIRST EXAMPLE)

(FIRST EXAMPLE)

(SECOND EXAMPLE)

(THIRD EXAMPLE)

(THIRD EXAMPLE)

(FOURTH EXAMPLE)

(FOURTH EXAMPLE)

(FOURTH EXAMPLE)

(FIFTH EXAMPLE)

(FIFTH EXAMPLE)

(FIFTH EXAMPLE)

(SIXTH EXAMPLE)

(SIXTH EXAMPLE)

(SIXTH EXAMPLE)

(SIXTH EXAMPLE)

FIG. 16 (REFERENCE CASE)
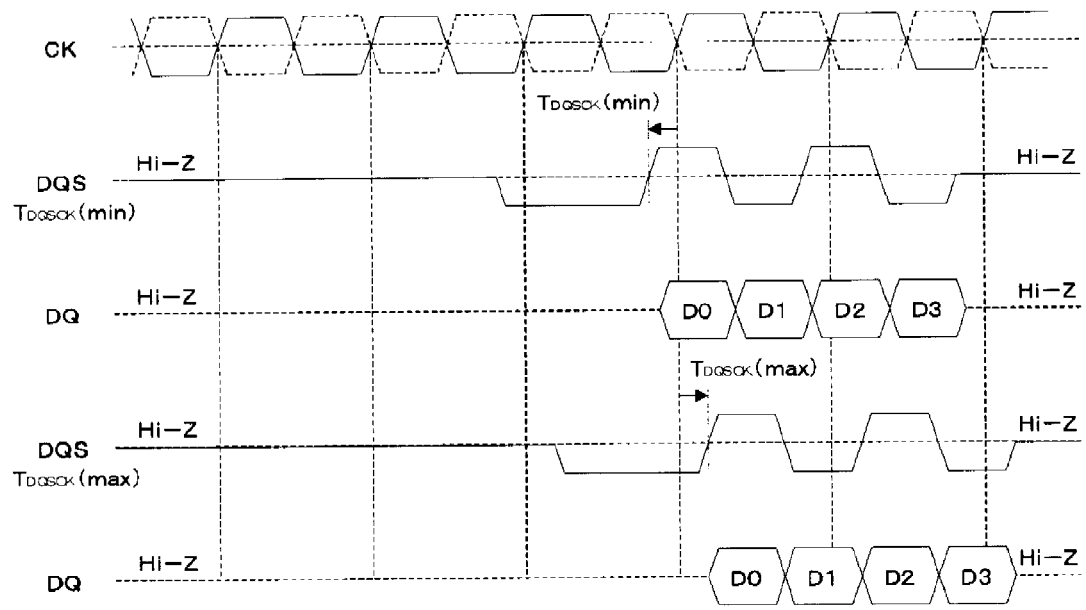
FIG. 17 (RELATED ART)
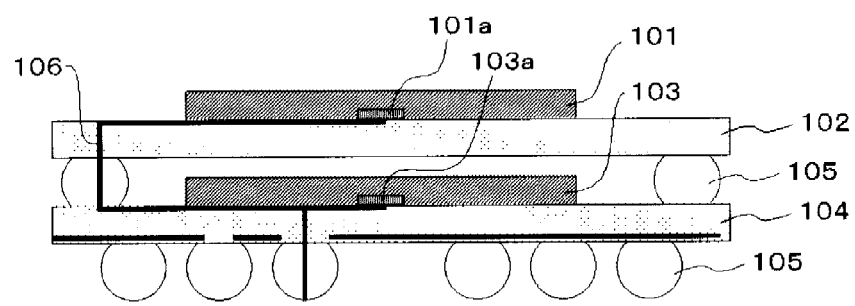

STACKED SEMICONDUCTOR DEVICE

REFERENCE TO RELATED APPLICATIONS

The present application is claiming the priority of the earlier Japanese patent application No. 2006-163735 filed on Jun. 13, 2006, the entire disclosure thereof being incorporated herein by reference thereto.

FIELD OF THE INVENTION

This invention relates to a stacked semiconductor device including a plural number of memory chips stacked together in lamination. More particularly, this invention relates to a stacked semiconductor device including memory chips of, for example, a DDR SDRAM or a DDR2 SDRAM.

BACKGROUND OF THE INVENTION

In a stacked semiconductor device including a plural number of memory chips stacked together, such as a memory module, an SDRAM (Synchronous Dynamic Random Access Memory), latching a variety of control signals by a rising edge of a fundamental input clock signal (CK signal) to input/output data in synchronization with the CK signal, is in widespread use. The SDRAM uses only the rising edge of the CK signal, whereas a DDR SDRAM (Double Data Rate Synchronous Dynamic Random Access Memory) uses both the rising and falling edges of a data strobe signal (DQS signal) to input/output data to implement a double volume data transmission with the same CK signal. This DQS signal is a control signal for inputting/outputting data per cycle.

In contrast to the DDR SDRAM, pre-fetching two bits, the DDR2 SDRAM (Double Data Rate 2 Synchronous Dynamic Random Access Memory), pre-fetching redoubled bits, that is, four bits, has been developed. The DDR SDRAM uses a data strobe signal (DQS signal) to minimize the timing skew (timing distortion) generated between the memory and a memory controller upon data input/output. The DDR2 SDRAM uses a differential data strobe signal (DQS signal) and an inverted differential data strobe signal (/DQS signal). The DQS signal and the /DQS signal may be changed by EMRS (Extended Mode Register Set) and hence may be used as the same single-ended DQS signal as that used in the DDR SDRAM. In the DDR SDRAM and in the DDR2 SDRAM, the data signals (DQ signals) and the DQS signal are transmitted from a memory controller to a memory during the data write and from the memory to the memory controller during data readout. That is, the DQ signal and the DQS signal are bi-directionally transmitted between the memory and the memory controller. In general, one DQS signal is allocated per 4 bits of data with an SDRAM having a ×4 bit constitution and per 8 bits of data with an SDRAM having a ×8 bit constitution.

In the routine DDR SDRAM and DDR2 SDRAM, the JEDEC standard specification holds as a specification for data readout between the CK and the DQS signals. That is, in the case of a data transmitting rate of 400 Mbps, a skew between the CK and DQS signals ($T_{DQSCK}$) up to ±500 [ps] is allowed, as indicated by an output timing for the DDR2 SDRAM2 of FIG. 16. In other words, the allowed interval between the shortest period of time and the longest period of time from outputting of the CK signal until outputting the DQS signal is 1000 [ps]. It is noted that $T_{DQSCK}$(min) indicates the earliest timing at which the DQS signal is output from the DDR2 SDRAM to the memory controller, with the edge of the CK signal as reference, and that $T_{DQSCK}$(max) indicates the latest timing at which the DQS signal is output from the DDR2 SDRAM to the memory controller, with the edge of the CK signal as reference.

Meanwhile, as a technique which enables an increased storage capacity per unit volume and high density packaging, there has been disclosed in e.g., Patent Document 1 a memory module in which two memory chips are assembled together back-to-back in a stacked configuration (stacked semiconductor device) (see Patent Document 1).

[Patent Document 1] JP Patent Kokai Publication No. JP-P2004-158892A (FIG. 5)

[Patent Document 2] JP Patent Kokai Publication No. JP-P2002-169721A

[Patent Document 3] JP Patent Kokai Publication No. JP-P2005-156328A

[Patent Document 4] JP Patent Kokai Publication No. JP-A-11-202970

SUMMARY OF THE DISCLOSURE

The following analysis is given by the present invention. The entire disclosures of the above mentioned Patent Documents are herein incorporated by reference thereto.

However, the routine stacked semiconductor devices are plagued with the following problem. In general, one DQS signal is allocated per 4 bits of data with an SDRAM having a ×4 bit constitution and per 8 bits of data and with an SDRAM having a ×8 bit constitution, as described above. In addition, with the wiring of the routine stacked semiconductor devices, the branched wiring is used for a plural number of memories to share the sole wire. Thus, with the routine stacked semiconductor devices, the waveform of the DQS signal is distorted and deteriorated because of reflection at the branch point to render high speed transmission difficult.

For example, consider a case with a stacked semiconductor device having a memory package made up of package substrates 102 and 104 stacked together, as shown in FIG. 17. A DRAM chip 101 is mounted on the package substrate 102, and the resulting assembly is stacked via ball terminals 105 on the package substrate 104 carrying another DRAM chip 103. In this case, the problem of waveform distortion is presented at high speed transmission because of reflection caused by a branched path 106. In addition, in this memory package, signal skew of the DQS signal needs to be reduced to increase the transmission speed further.

Also, in a stacked semiconductor device, including a memory package having a memory substrate 202 on both sides of which are mounted DRAM chips 201, 203, as shown in FIG. 18, waveform distortion caused by reflection is diminished because of a shorter wiring length from a branch point of a wiring section 206 between pads 201a and 203a. However, to increase the transmission speed further, the signal skew of the DQS signal needs to be reduced.

Further, consider the case of stacking two DDR2 SDRAMs, with a data transmission rate of, for example, 400 Mbps, as a routine stacked semiconductor device. Since the signal skew ($T_{DQSCK}$) of the DQS signals between the two DDR2 SDRAMs is ±500 [ps], the signal skew of the DQS signals of the two DDR2 SDRAMs is 1000 [ps] at the maximum. Thus, it is probable that the faster the data transmission speed, the more difficult it is to supply data valid for a desired cycle of the CK signal to the memory controller.

It is an object of the present invention to eliminate waveform distortion at high speed transmission in case of stacking a plural number of memory chips. That is, a first object of the present invention is relevant to the package substrate having the wiring for transmitting a data strobe signal.

It is another object of the present invention to eliminate signal skew of the data strobe signal transmitted between the memory chips upon data readout to secure a timing margin of the setup time and the hold time of the memory controller. That is, a second object of the present invention is relevant to the memory chip outputting a data strobe signal upon data readout.

In a first aspect, the present invention provides a stacked semiconductor device comprising a plurality of memory chips stacked together, A pair of a data strobe signal and an inverted data strobe signal, as control signals for inputting/outputting data twice per cycle, are used as two single-ended data strobe signals. A data strobe signal line for the data strobe signal is connected to a first one of the memory chips, and an inverted data strobe signal line for the inverted data strobe signal is connected to a second one of the memory chips mating with the first memory chip.

In a second aspect, the present invention provides a stacked semiconductor device comprising a plurality of memory chips stacked together. A data strobe signal, as a control signal for inputting/outputting data twice per cycle, is coupled to a first memory chip of the memory chips, and a second memory chip of the memory chips mates with the first memory chip. The first and second memory chips each include a circuit and a wiring for synchronizing the strobe signals each other upon readout.

The meritorious effects of the present invention are summarized as follows.

According to the present invention, it is possible to increase the data transmitting speed in a stacked semiconductor device including plural memory chips stacked together.

According to the first aspect of the present invention, data strobe signals are not branched, so that the load on the transmission line is decreased, thereby allowing the recording capacity and the data transmitting speed to be increased.

According to the second aspect of the present invention, the frequency of the clock signal may be increased regardless of the signal skew between the clock signal and the data strobe signal, thereby increasing the recording capacity and the data transmitting speed.

BRIEF DESCRIPTION OF THE DRAWINGS

FIG. 16 is a timing chart showing the data output timing at a transmission rate of 400 Mbps of a DDR2 SDRAM.

FIG. 17 is a partial cross-sectional view schematically showing the constitution of a stacked semiconductor device of the related art.

PREFERRED MODES OF THE INVENTION

Figure 1:
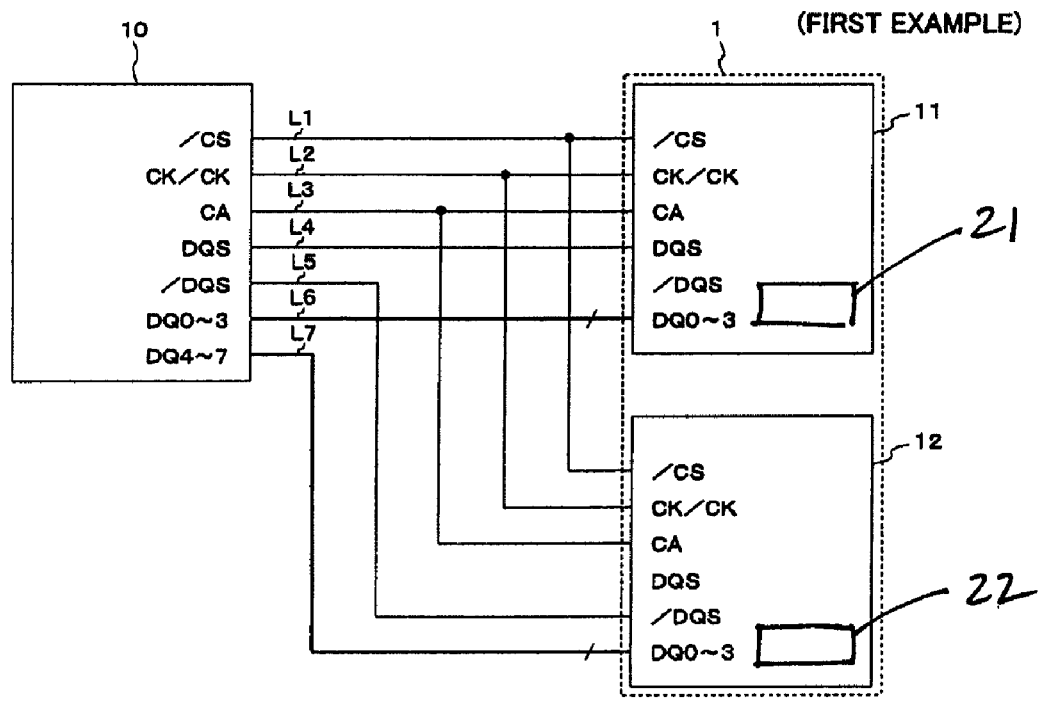
FIG. 1 is a block diagram schematically showing the constitution of a stacked semiconductor device according to a first example of the present invention.

In the first aspect of the present invention, the following modes may be employed with advantage.

The data strobe signal line may be connected to a data strobe signal pad of the first memory chip; and the inverted data strobe signal line may be connected to an inverted data strobe signal pad of the second memory chip.

The inverted data strobe signal line may be not connected to the inverted data strobe signal pad of the first memory chip, and the data strobe signal line may be not connected to the data strobe signal pad of the second memory chip.

The first memory chip may be settable to a state of inhibiting interrupt of the data strobe signal by a built-in expansion mode register, and the second memory chip may be settable to a state of inhibiting interrupt of the data strobe signal by a built-in expansion mode register.

The first and second memory chips may each include a switching pad dedicated to the data strobe signal; the first memory chip controlling inputting/outputting of a data signal with the data strobe signal by the switching pad of the first memory chip being open or connected to a power supply; the second memory chip controlling inputting/outputting of the data signals with the data strobe signal by the switching pad of the second memory chip being connected to the ground.

The data strobe signal line may be connected to the data strobe signal pad of the first memory chip; the inverted data strobe signal line may be connected to the data strobe signal pad of the second memory chip; the first and second memory chips may each include a switching pad dedicated to the data strobe signal; the first memory chip may control inputting/outputting of the data signals with the data strobe signal by the switching pad of the first memory chip being open or connected to a power supply; and the second memory chip may invert the inverted data strobe signal supplied from the data strobe signal pad to form a data strobe signal by the switching pad of the second memory chip being connected to ground; the second memory chip inverting a data strobe signal output from an internal circuit of the second memory chip to form an inverted data strobe signal.

The inverted data strobe signal pad of each of the first and second memory chips may be not connected to the data strobe signal line nor to the inverted data strobe signal line.

In the second aspect of the present invention, the following modes may be employed with advantage.

The first and second memory chips may each include: a clock driver that generates a clock signal; a latch circuit that output-controls a data signal and the data strobe signal based on the clock signal; and a clock switch arranged in a wiring between the clock driver and a latch circuit; the clock driver and the clock switch becoming conductive by the clock switch of the first memory chip being connected to a power supply; the clock driver and the latch circuit clock switch being disconnected from each other by the clock switch of the second memory chip being connected to ground; and the latch circuit of the first memory chip may be connected to the latch circuit of the second memory chip via a wiring.

The first and second memory chips each may include: a clock driver that generates a clock signal; a first latch circuit that output-controls a data signal and the data strobe signal based on the clock signal; a synchronizing circuit that outputs a data strobe signal from the first latch circuit of the first memory chip or a data strobe signal from the first latch circuit from the second memory chip, whichever is later in an input timing; and a second latch circuit that exercises output control of data signals from the first latch circuit based on a data strobe signal from the synchronizing circuit.

In order to increase the transmitting speed, the problem of reflection needs to be solved and, in order to increase the transmitting speed further, the problem of skew as well as that of reflection has to be solved. To this end, the present invention includes six examples. Of these, the first to fourth examples are directed to removing the waveform distortion of the data strobe signal (DQS signal) caused by reflection. The fifth and sixth examples are directed to removing the signal skew of the data strobe signal using the timing synchronization system of the second aspect of the present invention, additional to the stacked constitution of the related art shown in FIG. 18.

First Example

A stacked semiconductor device of a first example of the present invention is now described with reference to the drawings. FIG. 1 depicts a block diagram schematically showing the constitution of the stacked semiconductor device according to the first example of the present invention.

Referring to FIG. 1, a stacked semiconductor device 1 is a DDR2 SDRAM of a ×8 bit constitution comprising two DDR2 SDRAM chips stacked together. These two DDR2 SDRAM chips are memory chips 11, 12 each being of a ×4 bit constitution. The stacked semiconductor device 1 is designed to control the input/output of data signals (DQ signals) of the memory chips 11, 12, based on data strobe signals (DQS signals) and inverted data strobe signals (/DQS signals) from a memory controller 10. In the stacked semiconductor device 1, a set of one DQS signal and one /DQS signal is allocated to each 8-bit data. The stacked semiconductor device 1 is electrically connected to the memory controller 10 via a /CS signal line L1, a CK/CK signal line L2, a CA signal line L3, a DQS signal line L4, a /DQS signal line L5, a first DQ signal line L6 and a second DQ signal line L7.

The memory controller 10 is responsive to a request from a processor, not shown, to control data readout or data write for the memory chips 11, 12. The first memory chip 11 is a memory chip of the lower DDR2 SDRAM, while the second memory chip 12 is a memory chip of the upper DDR2 SDRAM.

The /CS signal line L1 is a transmission path of a chip select signal (/CS signal) for selecting a memory chip which is to carry out signal readout or write, and electrically interconnects /CS signal pads of the memory controller 10, the first memory chip 11 and the second memory chip 12. That is, the /CS signal line L1 is wired as it regards the two memory chips 11, 12 as being of the same rank. The CK/CK signal line L2 is a transmission path for a clock signal (CK signal) and an inverted clock signal (/CK signal), and electrically interconnects CK/CK signal pads of the memory controller 10, the first memory chip 11 and the second memory chip 12. The CA signal line L3 is a transmission path for command/address signals (CA signals) including commands and addresses for readout or write, and electrically interconnects CA/CA signal pads of the memory controller 10, the first memory chip 11 and the second memory chip 12.

The DQS signal line L4 is a transmission path for the data strobe signal (DQS signal), which is a control signal for inputting/outputting data twice per cycle, and which electrically interconnects DQS signal pads of the memory controller 10 and the first memory chip 11. The /DQS signal line L5 is a transmission path for the inverted data strobe signal (/DQS signal), inverted from the DQS signal, and electrically interconnects DQS signal pads of the memory controller 10 and the second memory chip 12. The first DQ signal line L6 is a set of transmission paths for data signals (DQ0 to DQ3) of data to be read out or written, and electrically interconnects DQ0 to DQ3 signal pads of the memory controller 10 and the corresponding DQ0 to DQ3 signal pads of the first memory chip 11. The second DQ signal line L7 is a set of transmission paths for data signals (DQ4 to DQ7) of data to be read out or written, and electrically interconnects DQ4 to DQ7 signal pads of the memory controller 10 and the corresponding DQ0 to DQ3 signal pads of the second memory chip 12.

The first memory chip 11 is not connected to the /DQS signal line L5, and can be set by EMRS (Extended Mode Register Set) (21) to an interrupt inhibit state (Disable) with respect to the /DQS signal. The second memory chip 12 is not connected to the DQS signal line L4, and can be set by EMRS (Extended Mode Register Set) (22) to an interrupt inhibit state (Disable) with respect to the DQS signal.

Figure 2:
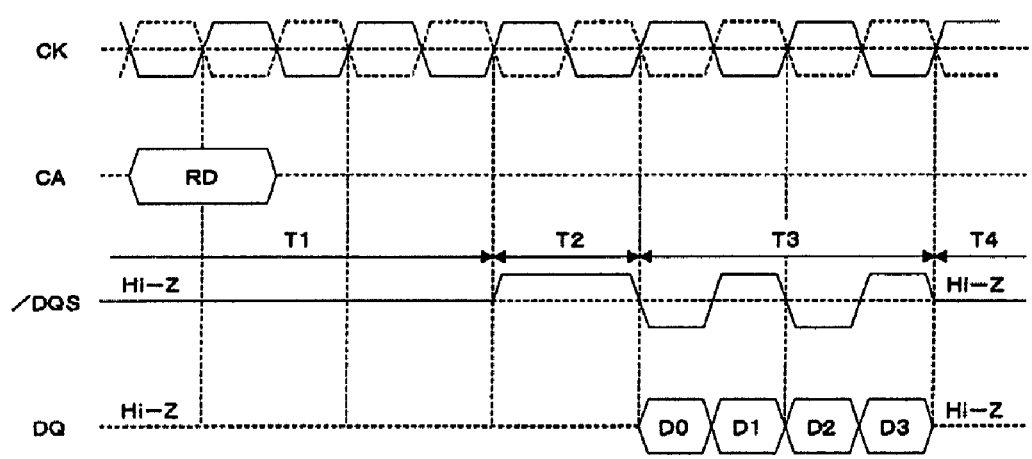
FIG. 2 is a timing chart for illustrating the timing of a /DQS signal and DQ signals at signal readout of the stacked semiconductor device according to the first example of the present invention.
Figure 3:
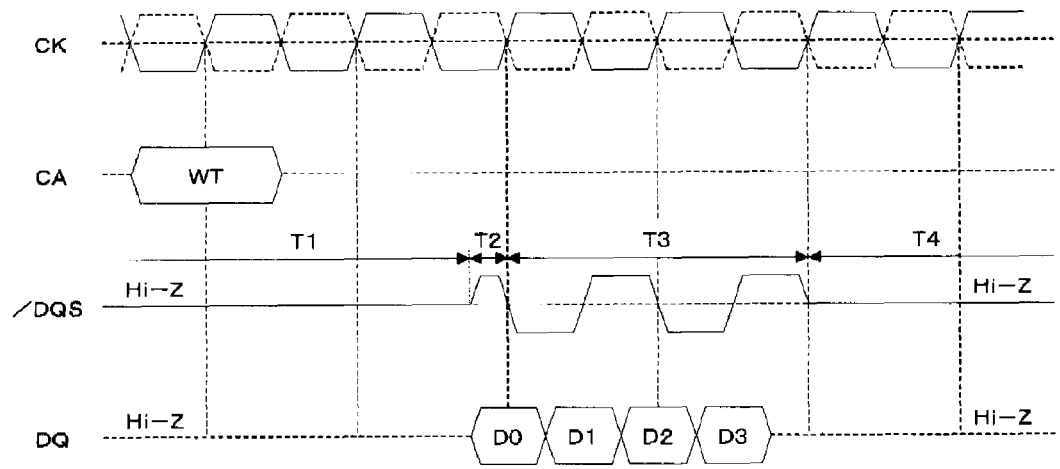
FIG. 3 is a timing chart for illustrating the timing of the /DQS signal and the DQ signals at signal write of the stacked semiconductor device according to the first example of the present invention.

The operation of the stacked semiconductor device according to the first example of the present invention is now described with reference to the drawings. FIG. 2 depicts a timing chart for illustrating the timing of the /DQS signal and the DQ signals during signal readout of the stacked semiconductor device according to the first example of the present invention. FIG. 3 is a timing chart for illustrating the timing of the /DQS signal and the DQ signal at signal write of the stacked semiconductor device according to the first example of the present invention.

The timing of the /DQS and DQ signals during readout is now described. When no data signal (DQ signal) is output, an inverted data strobe signal (/DQS signal) is in high-impedance (Hi-Z) state (see FIG. 2 (T1)). After a readout command (RD) as a command/address signal (CA signal) is received, the /DQS signal becomes HIGH about one clock before data outputting (see FIG. 2 (T2)). Thereafter, the /DQS signal begins toggling at the same frequency as that of the clock signal (CK signal) (see FIG. 2 (T3)). The /DQS signal continues toggling until the end of burst read and, after the end of the burst read, is again in the high impedance (Hi-Z) state (see FIG. 2 (T4)).

The timing of the /DQS and DQ signals upon signal write is now described. When no data signal (DQ signal) is received, the inverted data strobe signal (/DQS signal) is in the high-impedance (Hi-Z) state (see FIG. 3 (T1)). After a write command (WT) as a command/address signal (CA signal) is received, the /DQS signal becomes HIGH about one fourth of a clock before receiving the data (see FIG. 3 (T2)). Thereafter, the /DQS signal begins toggling at the same frequency as that of the clock signal (CK signal) (see FIG. 3 (T3)). The /DQS signal continues toggling until the end of burst write and, after the end of the burst write, assumes again the high impedance (Hi-Z) state (see FIG. 3 (T4)).

In the stacked semiconductor device of the first example, in which two DDR2 SDRAMs, each having a ×4 bit constitution, are stacked together to constitute a DDR2 SDRAM of the ×8 bit constitution, it is possible for a DRAM chip to control the inputting/outputting of the DQ signals with the /DQS signal. Further, branching of the DQS and /DQS signal lines is removed, so that it is possible to eliminate waveform distortion otherwise caused by reflection of the DQS and /DQS signal lines, and hence to eliminate waveform distortion during high-speed signal transmission.

Second Example

Figure 4:
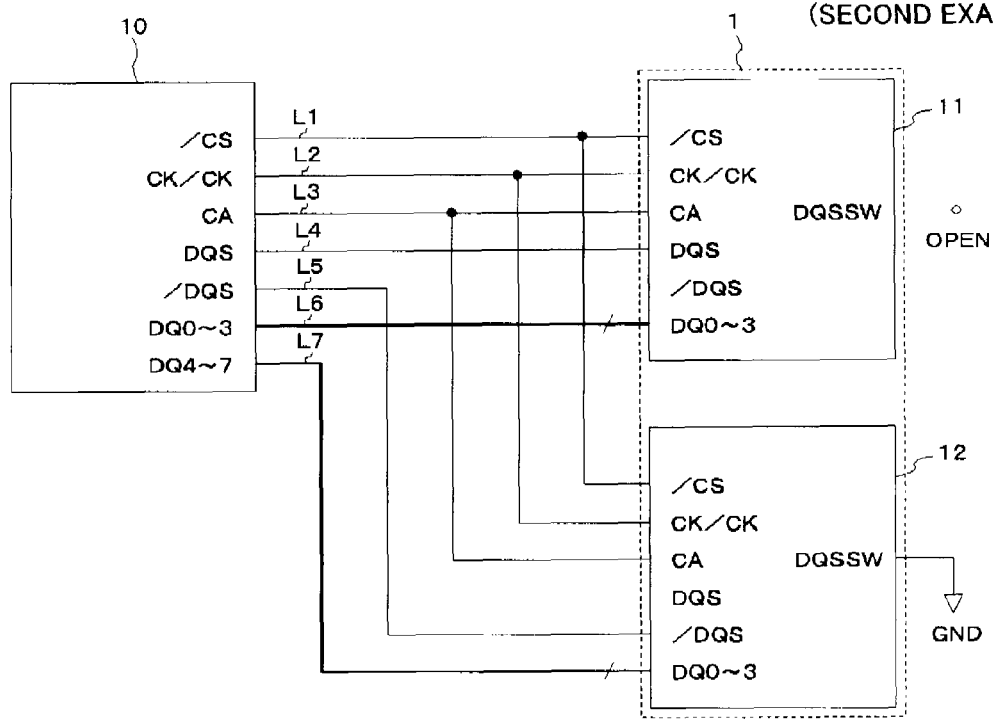
FIG. 4 is a block diagram schematically showing the constitution of a stacked semiconductor device according to a second example of the present invention.

A stacked semiconductor device of a second example of the present invention is now described with reference to the drawings. FIG. 4 depicts a block diagram schematically showing the constitution of the stacked semiconductor device according to the second example of the present invention.

In the second example of the stacked semiconductor device 1, as in the first example, described above, two DDR2 SDRAM chips, as memory chips 11, 12, each being of a ×4 bit constitution, are stacked together to constitute a DDR2 SDRAM of a ×8 bit constitution. The stacked semiconductor device 1 is configured for controlling inputting/outputting of the data signals (DQ signals) of the memory chips 11, 12, based on the data strobe signal (DQS signal) and the inverted data strobe signal (/DQS signal) from the memory controller 10. The present second example of the stacked semiconductor device 1 differs from the above-described first example in that, in the memory chips 11, 12, the DQS signal, controlling the inputting/outputting of the data signals (DQ), is changed over depending on the state (open/shorting) of the switching pads (DQSSW pads) dedicated to the DQS signals.

The memory chips 11, 12 are provided with the DQSSW pads dedicated to the DQS signal. The DQSSW pads change over the data strobe signal (DQS), which controls the inputting/outputting, by open/shorting. If the DQSSW pad is open, the memory chips 11, 12 control the inputting/outputting of the DQ signal with the DQS signal, as before. It is noted that connection to VDD is desirable because the logic may become indefinite in the open state. If conversely the DQSSW pad is shorted, that is, connected to GND, the memory chips 11, 12 manage DQ signal control by the /DQS signal. Since the DQS signal line L4 electrically interconnects the DQS signal pad of the memory controller 10 and the DQS signal pad of the first memory chip 11, in FIG. 4, the switching pad DQSSW of the first memory chip 11 is open. Additionally, since the /DQS signal line L5 electrically interconnects the /DQS signal pad of the memory controller 10 and the DQS signal pad of the second memory chip 12, the switching pad DQSSW of the second memory chip 12 is shorted (grounded). The constitution and the operation of the second example are otherwise the same as those of the first example.

In the stacked semiconductor device of the second example for the stacked semiconductor device, providing the DDR2 SDRAM of the ×8 bit constitution, made up of two DDR2 SDRAM chips of the ×4 bit constitution, it is possible for the DRAM chip to control the inputting/outputting of the DQ signals with the /DOS signal. Additionally, the data strobe signal, controlling the inputting/outputting, may be changed over depending on the state of the switching pad DQSSW (open/shorting). Also, as in the first example, the DQS signal line as well as the /DQS signal line is not branched. This eliminates waveform distortion caused by reflection at the DQS signal line and the /DQS signal line and hence eliminates waveform distortion at high-speed transmission.

Third Example

Figure 5:
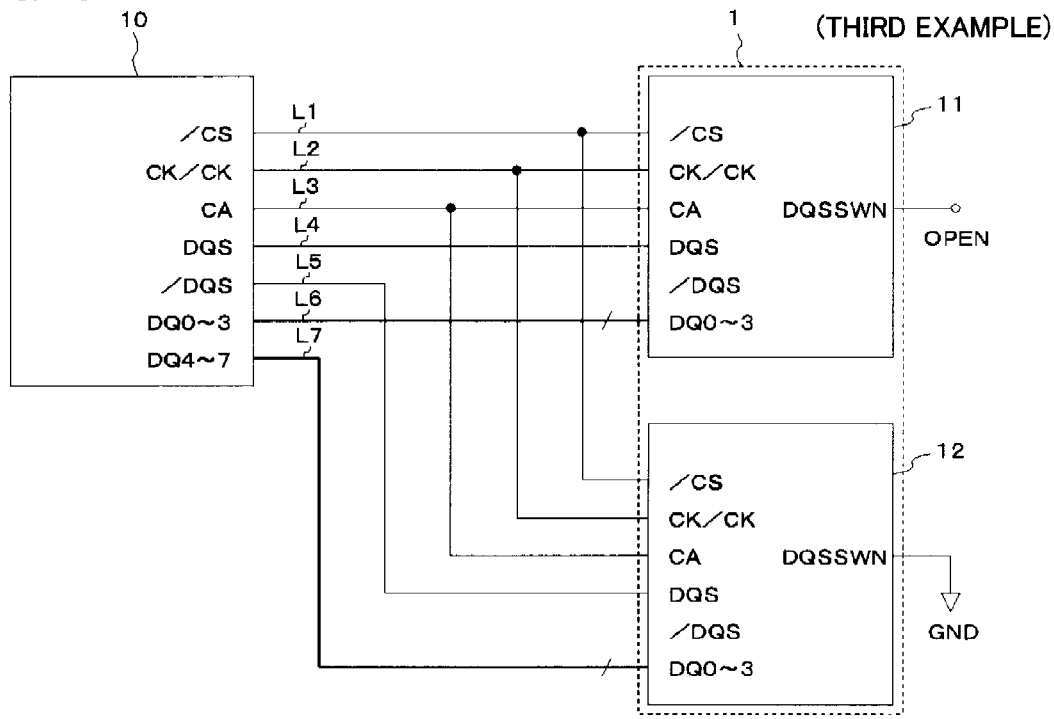
FIG. 5 is a block diagram schematically showing the constitution of a stacked semiconductor device according to a third example of the present invention.
Figure 6:
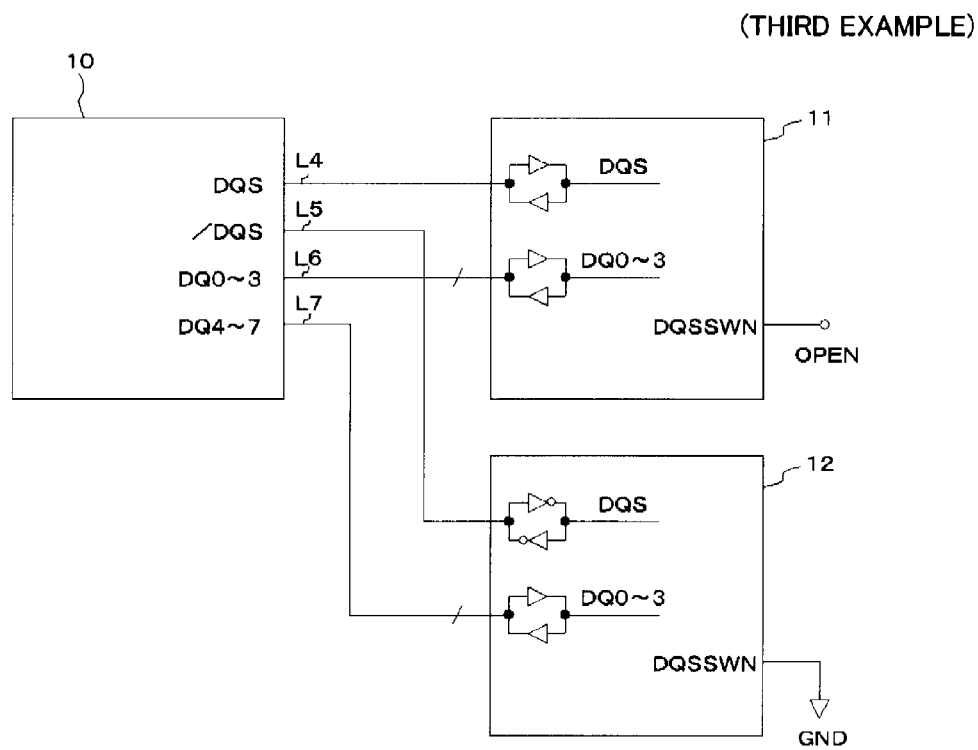
FIG. 6 is a block diagram for illustrating a circuit connected to a DQS signal pad of a second memory chip in the stacked semiconductor device according to the third example of the present invention.

A stacked semiconductor device of a third example of the present invention is now described with reference to the drawings. FIG. 5 depicts a block diagram schematically showing the constitution of the stacked semiconductor device according to the third example of the present invention. FIG. 6 is a block diagram showing a circuit connected to a DQS signal pad of a second memory chip in the stacked semiconductor device of the third example of the present invention.

In the present third example of the stacked semiconductor device, as in the first example, two DDR2 SDRAM chips, each of the ×4 bit constitution, providing the memory chips 11, 12, are stacked together to provide a DDR2 SDRAM chip of the ×8 bit constitution. The stacked semiconductor device 1 is designed to control the inputting/outputting of the data signals (DQ signals) of the memory chips 11, 12, based on the data strobe signal (DQS) signal and the inverted data strobe signal (/DQS signal) from the memory controller 10. The present third example of the stacked semiconductor device 1, like the second example, is designed to change over the DQS signal, controlling the inputting/outputting of the data signals (DQ signals), based on the state (open/shorting) of the switching pads DQSSWN dedicated to the DQS signals in the memory chips 11, 12. However, the third example differs from the second example in that, in the third example, there is provided a circuit for inverting the inputting/outputting on an inner wiring connected to the DQS signal pad of one of the memory chips (the second memory chip 12 in FIG. 4).

The /DQS signal line L5 is a transmission path for the inverted data strobe signal, inverted from the DQS signal (/DQS signal), and electrically interconnects the /DQS signal pad of the memory controller 10 and the DQS signal pad of the second memory chip 12.

The memory chips 11, 12 include switching pads DQSSWN dedicated to the DQS signals. The switching pads DQSSWN change over the data strobe signals (DQS signals) which control the inputting/outputting based on the open/shorting. When the switching pads DQSSWN are open, the memory chips 11, 12 control the inputting/outputting of the data signals (DQ signals) with the data strobe signals (DQS signals), as conventionally. However, connection to VDD is desirable because the logic may become indefinite in the open state. In contrast, if the DQSSW pads are shorted, that is, connected to GND, the /DQS signal, supplied to the DQS signal pad of the second memory chip 12, is converted into the DQS signal, which DQS signal is supplied to an internal circuit of the second memory chip 12, as shown in FIG. 6. A DQS signal, output from an internal circuit of the second memory chip 12, is inverted into a /DQS signal, which /DQS signal is output via DQS signal pad of the second memory chip 12 and /DQS signal line L5 to the /DQS signal pad of the memory controller 10. It is noted that the constitution and operation of the present third example are otherwise similar to those of the above-described second example.

With the present third example, in which a circuit for inverting the inputting/outputting of the data strobe signal (DQS signal) is added to the conventional memory chip, as shown in FIG. 6, the inverted data strobe signal (/DQS signal), supplied to the DQS signal pad, may be inverted to enable the data signals (DQ signals) to be latched in case the inverted data strobe signal (/DQS signal) is supplied to the DQS signal pad. Even in case where the memory chip outputs the data strobe signal (DQS signal), the data strobe signal may be inverted to output the inverted data strobe signal (/DQS signal) to the memory controller. Also, as in the first example, neither the DQS signal line nor the /DQS signal line is branched, to eliminate waveform distortion otherwise caused by reflection at the DQS signal line and the /DQS signal line and hence to eliminate waveform distortion at high-speed transmission.

Fourth Example

Figure 7A:
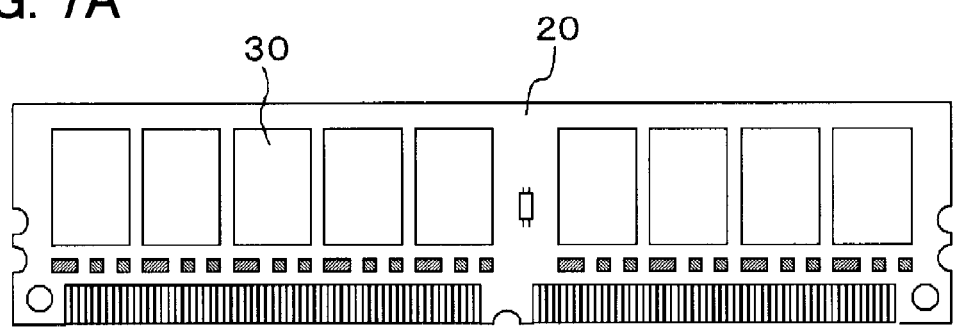
FIG. 7A is a front view schematically showing the appearance of a stacked semiconductor device according to a fourth example of the present invention.
Figure 7B:
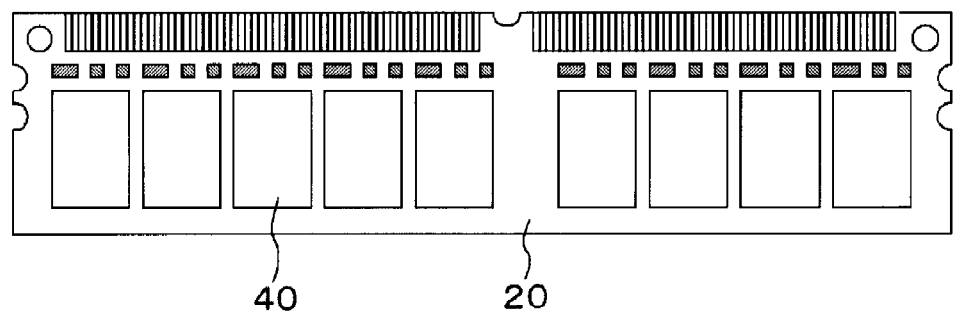
FIG. 7B is a bottom view thereof.
Figure 8:
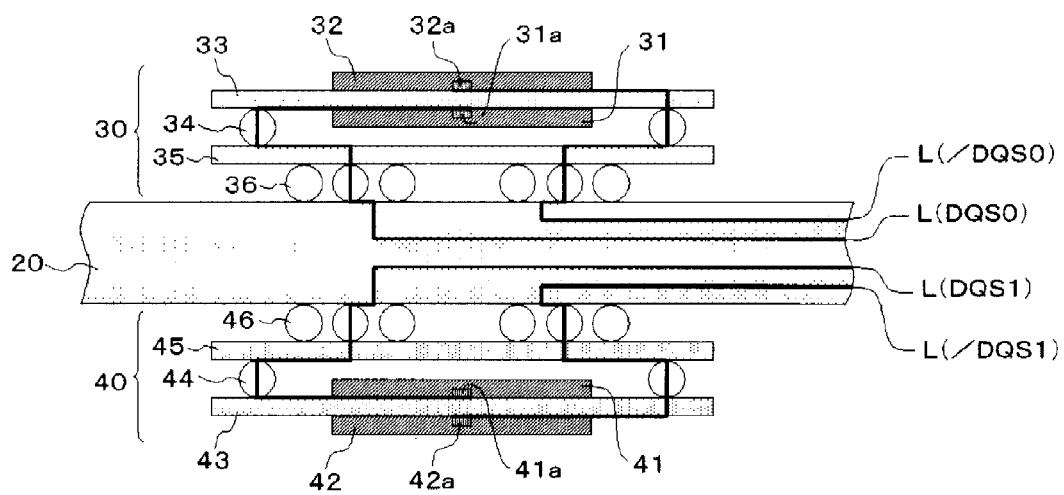
FIG. 8 is a partial cross-sectional view schematically showing the constitution of the stacked semiconductor device according to the fourth example of the present invention

A stacked semiconductor device of a fourth example of the present invention is now described with reference to the drawings. FIG. 7A depicts a schematic front view, and FIG. 7B depicts a schematic bottom plan view, showing the appearance of the stacked semiconductor device of the fourth example of the present invention. FIG. 8 is a partial cross-sectional view schematically showing the constitution of the stacked semiconductor device of the fourth example of the present invention.

A stacked semiconductor device 1 of the present fourth example comprises a module substrate and one or more of the memory chips of the first to third examples mounted thereon. The memory chips are designed to eliminate the waveform distortion otherwise caused by reflection of the DQS and /DQS signals, as described above.

In the stacked semiconductor device 1, memory packages 30 are mounted on one surface (front surface) and memory packages 40 are mounted on the other surface (reverse surface) of a module substrate 20.

The module substrate 20 is a wiring substrate for a module including an insulating layer on which is carried a wiring. In the constitution of FIGS. 7A and 7B and 8, a total of 9×2 memory packages 30, 40 are mounted and arranged side-by-side. In actuality for instance, 36 memory chips 31, 32, 41 and 42 are mounted on the module substrate 20. From the memory controller, not shown in FIGS. 7A and 7B and 8, these memory chips are equivalent to 18 memory chips of the double bit constitution. For example, if the two memory chips, each having the ×4 bit constitution, are stacked together to form a memory package of the ×8 bit constitution, the above memory chips are equivalent to 18 of the memory packages, each of the ×8 bit constitution, arranged on both sides of the module substrate 20. From another perspective, the above memory chips represent a memory device having memory banks 0 and 1, with the data width being 72 bits. On the module substrate 20, there may be also mounted an EEPROM, not shown, capacitors, not shown and various resistors, also not shown.

The memory package 30 is made up of the two memory chips 31, 32 stacked together. As for the memory package 30, the first memory chip 31 is mounted on one surface (reverse surface) and the second memory chip 32 is mounted on the opposite surface (front surface) of a package substrate 33 operating as a wiring substrate. The package substrate 33 is electrically connected to a packaging substrate 35, operating as a wiring (interconnecting) substrate, via ball terminals 34, while the packaging substrate 35 is electrically connected to the module substrate 20 via ball terminals 36. The first memory chip 31 includes a pad 31a electrically connected to a DQS0 signal line (L(DQS0)) electrically connected in turn to a DQS0 pad of the memory controller, herein not shown. The second memory chip 32 includes a pad 32a electrically connected to a /DQS0 signal line (L(/DQS0)) electrically connected in turn to a /DQS0 pad of the memory controller, herein not shown. The DQS0 signal line (L(DQS0)) is made up of a wiring of the module substrate 20, ball terminals 36, a wiring of the packaging substrate 35, ball terminals 34 and a wiring of the package substrate 33. The /DQS0 signal line (L(/DQS0)) is made up of a wiring of the module substrate 20, the ball terminal 36, the wiring of the packaging substrate 35, the ball terminal 34 and the wiring of the package substrate 33.

The memory package 40 is made up of the two memory chips 41, 42 stacked together. As for the memory package 40, the first memory chip 41 and the second memory chip 42 are mounted on one surface (reverse surface) and on the opposite surface (front surface) of a package substrate 43, operating as a wiring substrate, respectively. The package substrate 43 is electrically connected to a packaging substrate 45, operating as a wiring substrate, via ball terminals 44, while the packaging substrate 45 is electrically connected to the module substrate 20 via ball terminals 46. The first memory chip 41 includes a pad 41a electrically connected to a DQS1 signal line (L(DQS1)) electrically connected in turn to a DQS1 pad of the memory controller, herein not shown. The second memory chip 42 includes a pad 42a electrically connected to a /DQS1 signal line (L(/DQS1)) electrically connected in turn to a /DQS1 pad of the memory controller, herein not shown. The DQS1 signal line (L(DQS1)) is made up of a wiring of the module substrate 20, ball terminals 46, a wiring of the packaging substrate 45, ball terminals 44 and a wiring of the package substrate 43. The /DQS1 signal line (L(/DQS1)) is made up of the wiring of the module substrate 20, ball terminals 46, the wiring of the packaging substrate 45, ball terminals 44 and the wiring of the package substrate 43.

In FIG. 8, wirings other than the data strobe signal lines (L(DQS0) and L(DQS1)) and the inverted data strobe signal lines (L(/DQS0) and L(/DQS1)), ground planes or power supply planes are not shown.

In the present fourth example, in which branching of the data strobe signal line and the inverted data strobe signal line is removed, it is possible to remove waveform distortion at high speed transmission.

Fifth Example

Figure 9:
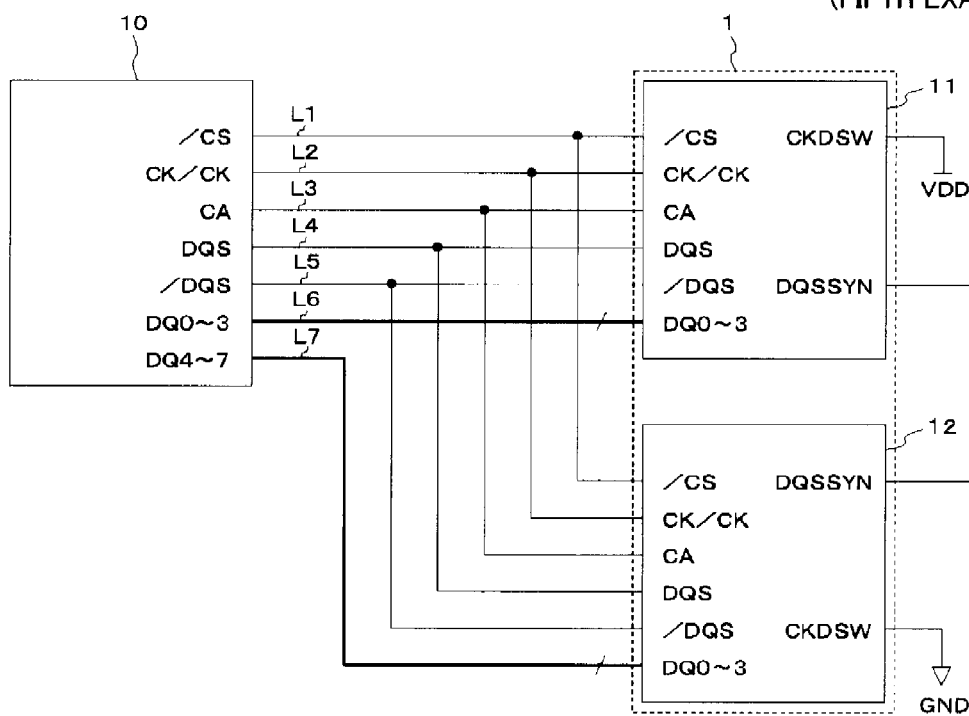
FIG. 9 is a block diagram schematically showing the constitution of a stacked semiconductor device according to a fifth example of the present invention.
Figure 10:
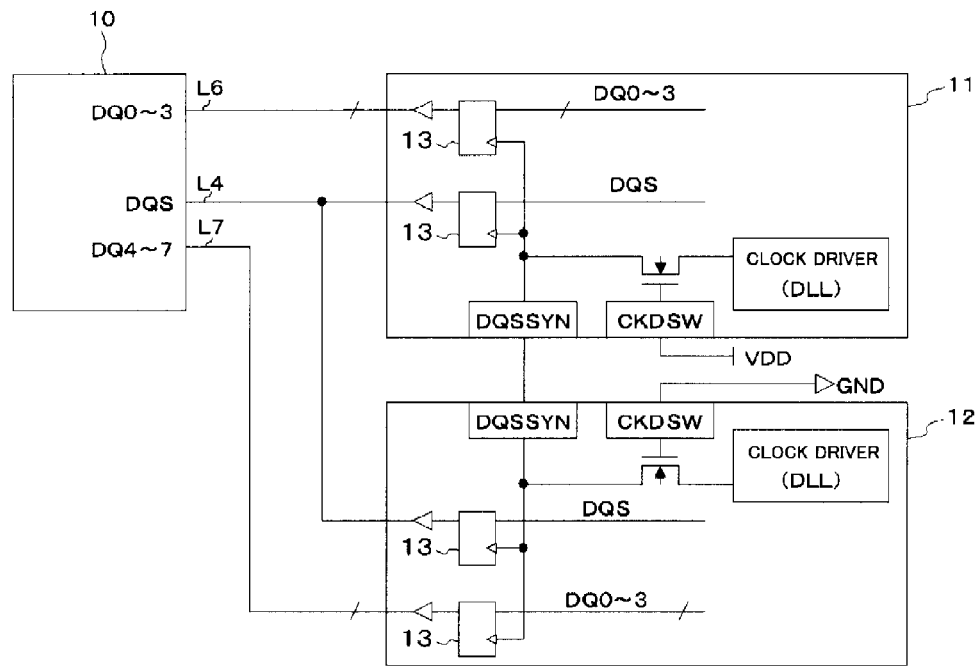
FIG. 10 is a block diagram for illustrating the circuit and the wiring pertinent to synchronization of the first and second memory chips in the stacked semiconductor device according to the fifth example of the present invention.

A stacked semiconductor device of a fifth example of the present invention is now described with reference to the drawings. FIG. 9 depicts a block diagram schematically showing the constitution of a stacked semiconductor device according to the fifth example. FIG. 10 depicts a block diagram for illustrating a circuit and a wiring relating to synchronization of the first and second memory chips in the stacked semiconductor device of the fifth example.

Similarly to the first example, the present fifth example of the stacked semiconductor device 1 includes two DDR2 SDRAM chips, each of the ×4 bit constitution, providing the memory chips 11, 12. These DDR2 SDRAM chips are stacked together to provide a DDR2 SDRAM chip of the ×8 bit constitution. To suppress the timing skew of the data strobe signal (DQS signal) upon readout, the stacked semiconductor device 1 includes a dedicated DQSSYN signal pad in each of the memory chips 11, 12 and a circuit for synchronizing the DQS signals within the two memory chips 11, 12. The stacked semiconductor device 1 is electrically connected to the memory controller 10 via a /CS signal line L1, a CK/CK signal line L2, a CA signal line L3, a DQS signal line L4, a /DQS signal line L5, a first DQ signal line L6 and a second DQ signal line L7.

The memory controller 10 is responsive to a request from a processor, not shown, to control the data readout or the data write for the memory chips 11, 12. The first memory chip 11 is a memory chip of the lower DDR2 SDRAM, while the second memory chip 12 is a memory chip of the upper DDR2 SDRAM.

The /CS signal line L1 is a transmission path for a chip select signal (/CS signal) for selecting a memory chip for readout or write, and electrically interconnects /CS signal pads of the memory controller 10, the first memory chip 11 and the second memory chip 12. That is, in case a mating set of DQS signals is allocated to 8-bit data, the /CS signal line L1 is wired as it regards the two memory chips 11, 12 to be of the same rank. The CK/CK signal line L2 is a transmission path for a clock signal (CK signal) and an inverted clock signal (/CK signal), and electrically interconnects CK/CK signal pads of the memory controller 10, the first memory chip 11 and the second memory chip 12. The CA signal line L3 is a transmission path for command/address signals (CA signals) including readout and write commands and addresses for readout or write, and electrically interconnects CA signal pads of the memory controller 10, the first memory chip 11 and the second memory chip 12.

The DQS signal line L4 is a transmission path for the data strobe signal (DQS signal), which is a control signal for inputting/outputting data twice per cycle, and electrically interconnects DQS signal pads of the memory controller 10 and the first memory chip 11 and the second memory chip 12. The /DQS signal line L5 is a transmission path for the inverted data strobe signal (/DQS signal), as inverted from the DQS signal, and electrically interconnects DQS signal pads of the memory controller 10, first memory chip 11 and the second memory chip 12. The first DQ signal line L6 is a set of transmission paths for readout or write data signals (DQ0 to DQ3), and electrically interconnects DQ0 to DQ3 signal pads of the memory controller 10 and the corresponding DQ0 to DQ3 signal pads of the first memory chip 11. The second DQ signal line L7 is a set of transmission paths for data signals (DQ4 to DQ7) of readout or write data, and electrically interconnects DQ4 to DQ7 signal pads of the memory controller 10 and the corresponding DQ0 to DQ3 signal pads of the second memory chip 12.

Timing skew takes place at readout between the data strobe signal (DQS) of the two stacked memory chips 11 and 12, as previously mentioned. To suppress this timing skew, there are provided dedicated CKDSW and DQSSYN pads, in the memory chips 11, 12, for synchronizing DQS signals within the two memory chips 11, 12.

One of clock drivers (DLLs) manages output control of the data signals (DQ signals) and the data strobe signal (DQS signal), depending on the states of connection (VDD/GND) of the CKDSW pad. Also, the DQSSYN signal pads are interconnected by wiring, as shown in FIG. 10, to control the DQ signals and DQS signals of the memory chips 11, 12 by the same clock driver (DLL). That is, in the first memory chip 11, to the CKDSW pad of which is connected the power supply VDD, the clock driver (DLL) and latch circuits 13 of the first memory chip 11 are electrically connected to each other when an unnumbered clock switch (transistor) is turned ON. Thus, output control of the DQ signals and the DQS signal is exercised by the clock driver (DLL) and the latch circuits 13 of the first memory chip 11. On the other hand, in the second memory chip 12, to the CKDSW pad of which is connected the ground (GND), the clock driver (DLL) and latch circuits 13 of the second memory chip 12 are disconnected from each other when an unnumbered clock switch (transistor) is turned OFF. Thus, output control of the DQ signals and the DQS signal is exercised by the clock driver (DLL) and the latch circuits 13 of the second memory chip 12.

It is preferred that the first and second memory chips 11, 12 are mounted on the package substrate so that pad surfaces of the two memory chips will face each other in order for a single wiring path to input/output a signal for the two memory chips. In this case, the wiring is necessarily branched. However, the wiring length from the branch point is short because branching may be made at proximate locations between the signal pads, thus reducing waveform distortion otherwise caused by reflection (or interference). Moreover, since the memory chips are mounted with the pad surfaces facing each other, it is possible to reduce the length of the wiring interconnecting the DQSSYN pads of the first and second memory chips 11, 12.

The fifth example may, of course, be combined with the fourth example described above.

Figure 11:
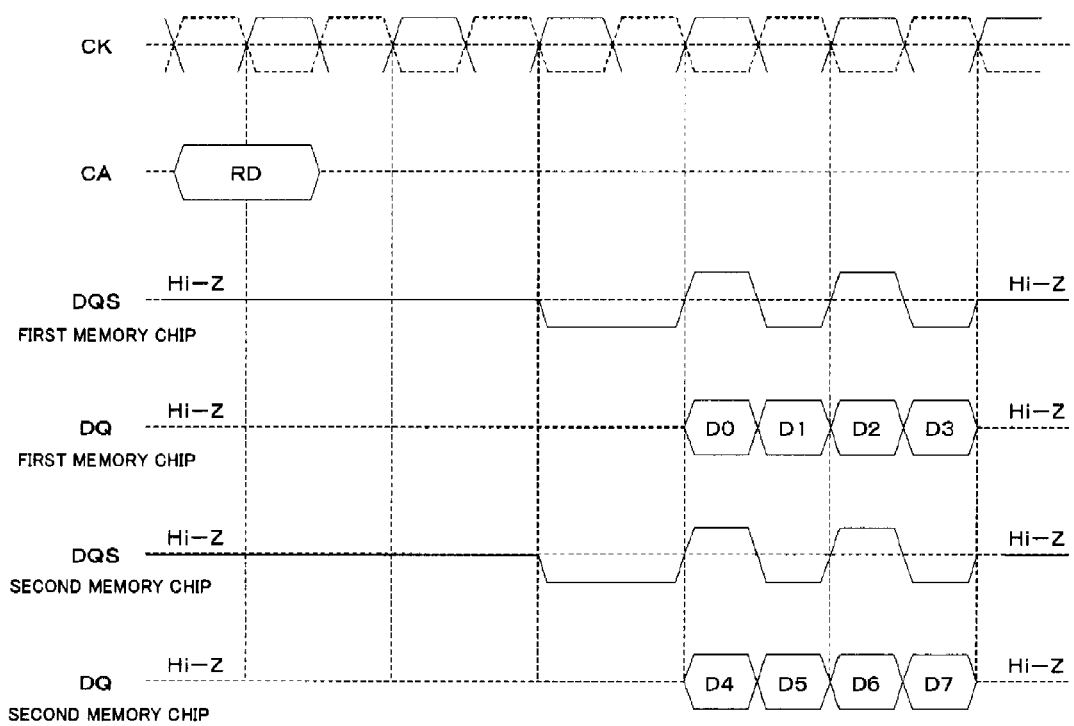
FIG. 11 is a timing chart showing data output timing at readout of the stacked semiconductor device of the fifth example of the present invention.

The operation of the stacked semiconductor device of the fifth example of the present invention is now described with reference to the drawings. FIG. 11 is a timing chart showing an output timing at readout of the stacked semiconductor device according to the fifth example.

Initially, at data readout, the memory controller 10 generates a readout command (RD) as a command/address signal (CA signal). The memory chips 11, 12 then receive the readout command (RD) from the memory controller 10, in synchronization with the clock signal (CK), and accordingly generates a data strobe signal (DQS) and readout data signals (DQ signals). FIG. 11 shows a case where eight readout data D0 to D7 are output, that is, a case where the value of BL (Burst Lengths) is '4'.

With the fifth example, in which data strobe signals are synchronized between the memory chips 11, 12, effective data may readily be received at a desired cycle of the data strobe signal, without decreasing the timing margin of the setup time and the hold time which may be caused by the skew of the data strobe signal, even though the data transmitting speed is increased. That is, the frequency of the clock signal may be increased to make for a high data transmitting speed regardless of the skew of the data strobe signals between the memory chips.

Sixth Example

Figure 12:
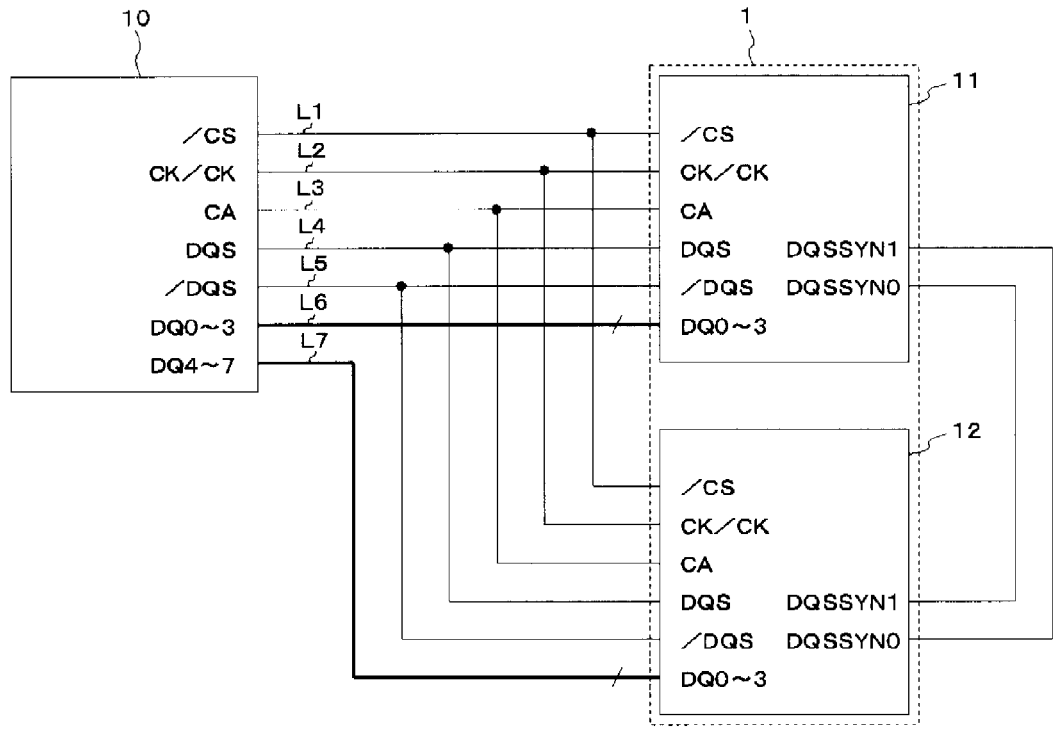
FIG. 12 is a block diagram schematically showing the constitution of a stacked semiconductor device according to a sixth example of the present invention.
Figure 13:
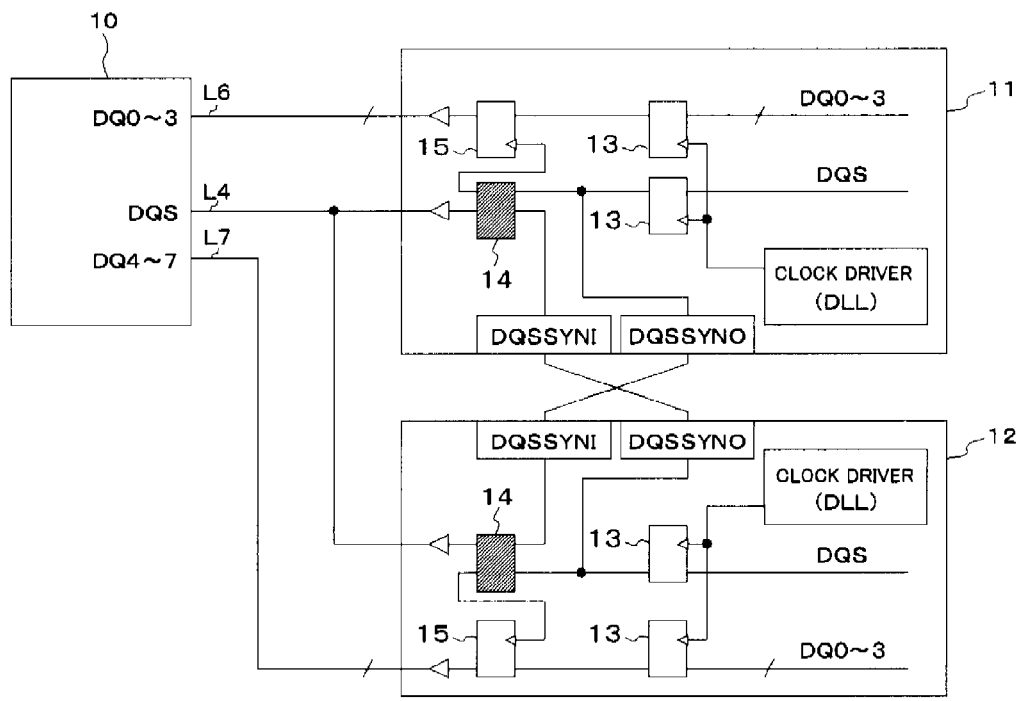
FIG. 13 is a block diagram for illustrating the circuit and the wiring pertinent to synchronization of the first and second memory chips in the stacked semiconductor device according to the sixth example of the present invention.
Figure 14:
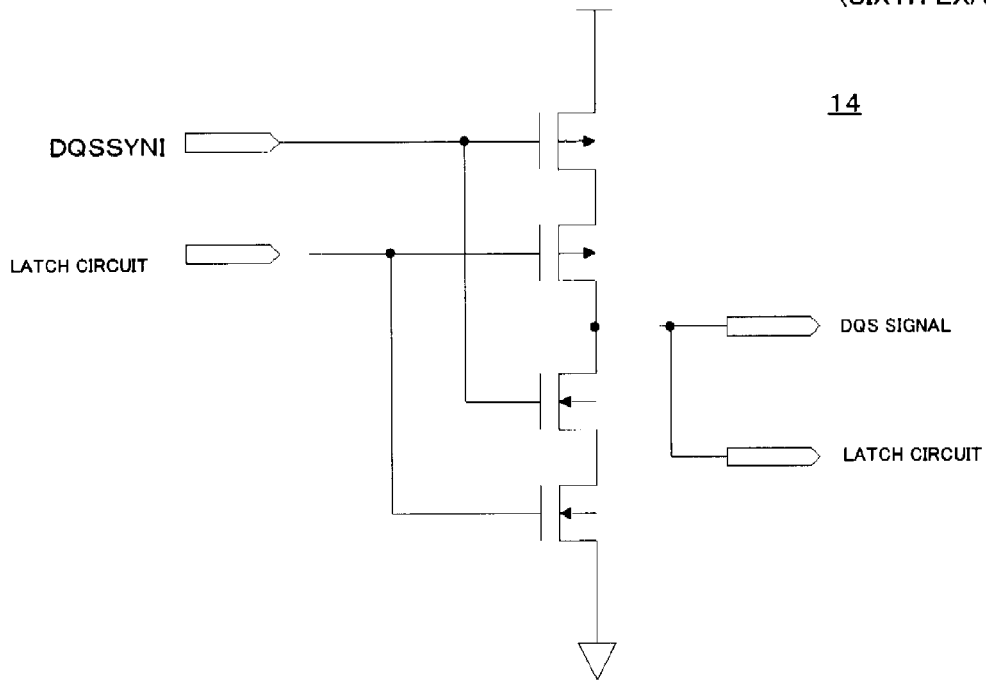
FIG. 14 is a schematic circuit diagram showing the constitution of a synchronization circuit in the stacked semiconductor device according to the sixth example of the present invention.

A stacked semiconductor device of a sixth example of the present invention is now described with reference to the drawings. FIG. 12 depicts a block diagram for illustrating the constitution of a stacked semiconductor device according to the sixth example. FIG. 13 depicts a block diagram for illustrating a circuit and a wiring relating to synchronization of the first and second memory chips. FIG. 14 depicts a circuit diagram schematically showing the constitution of a synchronization circuit in the stacked semiconductor device of the present sixth example.

Similarly to the first example, the present fifth example of the stacked semiconductor device 1 of the present example includes two DDR2 SDRAM chips, each of the ×4 bit constitution, providing the memory chips 11, 12. These DDR2 SDRAM chips are stacked together to provide a DDR2 SDRAM chip of the ×8 bit constitution. To suppress the timing skew of the data strobe signal (DQS signal) at readout, the stacked semiconductor device 1 includes, within the memory chips 11, 12, a circuit and a wiring for outputting data signals (DQ signals) in synchronization with the data strobe signal (DQS signal) delayed in its output timing.

Timing skew takes place upon readout between the data strobe signals of the two stacked memory chips 11 and 12, as previously mentioned. To suppress this timing skew, there are provided, in the memory chips 11, 12, a circuit and a wiring for outputting the data signals DQ in synchronization with the data strobe signal (DQS signal) delayed in its output timing.

Each of the memory chips 11, 12 is provided with a dedicated DQSSYNI pad and a dedicated DQSSYNO pad. The DQSSYNI pad of the first memory chip 11 is connected to the DQSSYNO pad of the second memory chip 12. The DQSSYNI pad of the second memory chip 12 is connected to the DQSSYNO pad of the first memory chip 11. The DQSSYNI pad of the first memory chip 11 is a pad for receiving the data strobe signal (DQS signal) generated in a synchronization circuit 14 of the second memory chip 12, and routes the received DQS signal to a synchronization circuit 14 of the memory chip 11. The DQSSYNO pad of the first memory chip 11 is a pad for outputting a data strobe signal (DQS signal) generated in the synchronization circuit 14 of the first memory chip 11, and outputs the DQS signal to the DQSSYNI pad of the second memory chip 12. The DQSSYNI pad of the second memory chip 12 is a pad for receiving the data strobe signal (DQS signal) generated in the synchronization circuit 14 of the first memory chip 11, and routes the received DQS signal to the synchronization circuit 14 of the memory chip 12. The DQSSYNO pad of the second memory chip 12 is a pad for outputting a data strobe signal (DQS signal) generated in the synchronization circuit 14 of the second memory chip 12, and outputs the DQS signal to the DQSSYNI pad of the first memory chip 11.

The signals DQ0 to DQ3 of the first memory chip 11 are output-controlled by the latch circuit 13, connected to the clock driver (DLL) of the first memory chip itself, and are then output-controlled by the latch circuit 15, connected to the synchronization circuit 14, so as to be output to the first DQ signal line L6. As for the DQS signal of the first memory chip 11, the DQS signal, output-controlled by the latch circuit 13, connected to the clock driver (DLL) of the memory chip 11, or the DQS signal, received by the DQSSYNI pad, whichever is later in the input timing, is selected by the synchronization circuit 14, supplied with both of these signals. The so selected DQS signal is output to the DQS signal line L4. The signals DQ0 to DQ3 of the second memory chip 12 are output-controlled by the latch circuit 13, connected to the clock driver (DLL) of the second memory chip itself. The signals are then output-controlled by the latch circuit 15, connected to the synchronization circuit 14, so as to be output to the second DQ signal line L7. As for the DQS signal of the second memory chip 12, the DQS signal, output-controlled by the latch circuit 13, connected to the clock driver (DLL) of the second memory chip, or the DQS signal, received by the DQSSYNI pad, whichever is later in the input timing, is selected by the synchronization circuit 14, supplied with both of these signals. The so selected DQS signal is output to the DQS signal line L4.

The synchronization circuits 14 each output the DQS signal, received by the DQSSYNI pad, or the DQS signal, generated in the own chip and received via latch circuit 13, whichever is later in the output timing. A circuit configuration of the synchronization circuit 14 is shown in FIG. 14, as an example.

Figure 18:
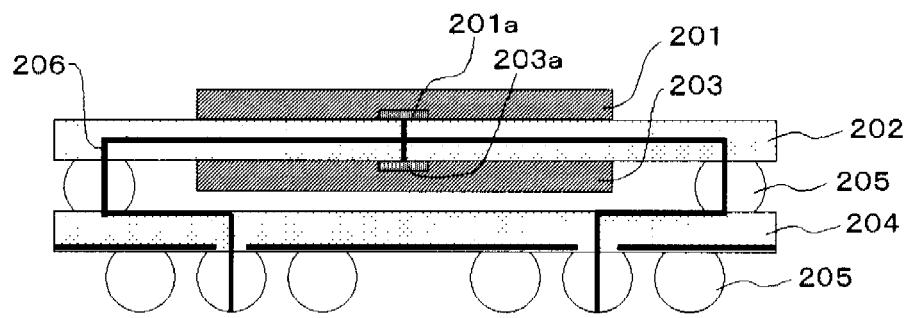
FIG. 18 a partial cross-sectional view schematically showing the constitution of another stacked semiconductor device of the related art.

Preferably, the first and second memory chips 11, 12 are mounted on a package substrate with pad surfaces of the two memory chips facing (opposing) each other, so that signals may be supplied to or output from the two memory chips via sole wiring path, as in the stacked-up constitution of FIG. 18. With this constitution, the wiring is necessarily branched. However, the wiring length from the branch point is short because the branch point is proximate to both pads. For this reason, the waveform distortion due to reflection is negligible. Additionally, with the memory chips mounted with the pad surfaces facing each other, the wiring interconnecting the DQSSYN pads of the first and second memory chips 11, 12 may be of extremely short lengths.

Meanwhile, the examples 6 and 4 may, of course, be combined together.

Figure 15:
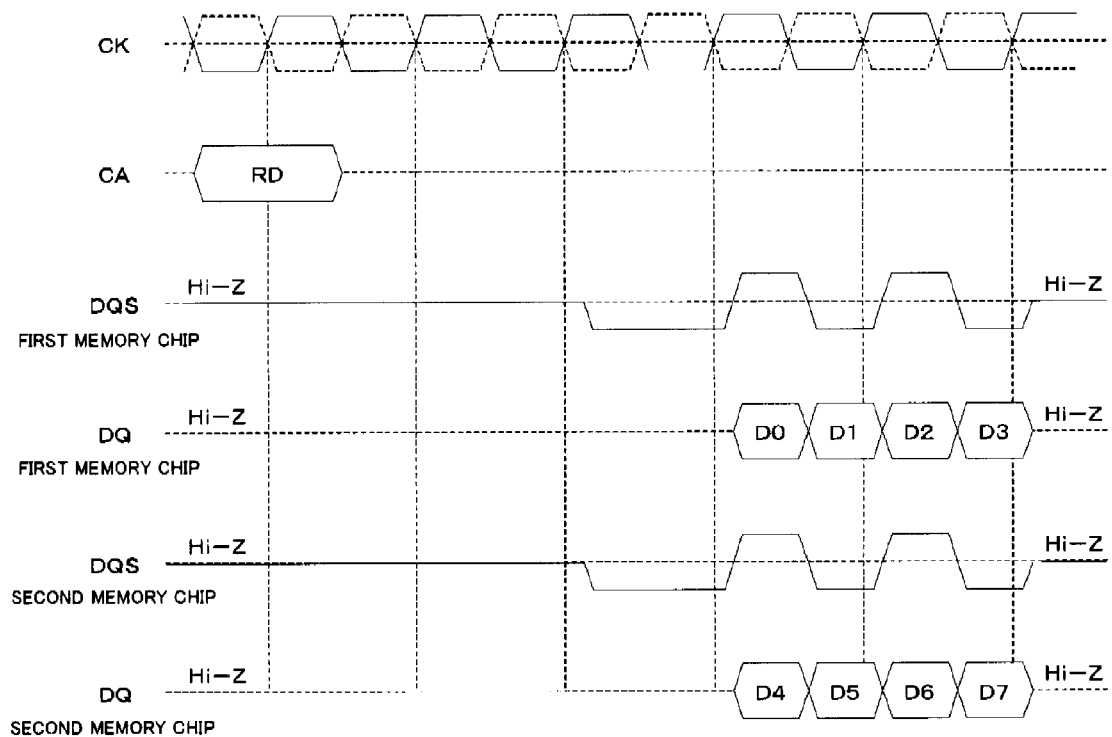
FIG. 15 is a timing chart showing the data output timing at readout of the stacked semiconductor device according to the sixth example of the present invention.

The operation of the stacked semiconductor device according to the sixth example of the present invention is now described with respect to the drawings. FIG. 15 depicts a timing chart showing the data outputting timing at readout of the stacked semiconductor device according to the sixth example.

In reading out data, initially the memory controller 10 generates the readout command (RD) as the command/address signal (CA signal). The memory chips 11, 12 receive the readout command (RD) from the memory controller 10, in synchronization with the clock signal (CK signal) to generate the data strobe signal (DQS signal) and the readout data signals (DQ signals). Since the data strobe signals (DQ signals) suffer signal skew in the memory chips 11, 12, DQ signals are output by the synchronization circuit 14 in timed (synchronized) relation to the data strobe signal with the later output timing. FIG. 15 shows a case where eight readout data D0 to D7 are output, that is, in which the BL (Burst Length) is 'four'.

With the sixth example, in which the data strobe signals are synchronized between the memory chips 11, 12, effective data may be more liable to be received at the desired cycle of the data strobe signal, even if the data transmitting speed is increased, without decreasing the timing margin of the setup time or the hold time in the memory controller 10 by the skew of the data strobe signal. In other words, the clock signal frequency may be increased regardless of the data strobe signal skew between the memory chips, thus allowing increasing the data transmitting speed.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A stacked semiconductor device comprising: a first memory chip including a first switching pad dedicated to a data strobe signal; a second memory chip including a second switching pad dedicated to an inverted data strobe signal, wherein the first memory chip controls inputting/outputting of a data signal with said data strobe signal by said first switching pad of the first memory chip being open or connected to a power supply, and the second memory chip controls inputting/outputting of said data signals with said data strobe signal by said second switching pad of the second memory chip being connected to the ground.

2. The stacked semiconductor device according to claim 1 wherein said data strobe signal line is connected to a data strobe signal pad of the first memory chip; and said inverted data strobe signal line is connected to an inverted data strobe signal pad of the second memory chip.

3. The stacked semiconductor device according to claim 2 wherein said inverted data strobe signal line is not connected to said inverted data strobe signal pad of the first memory chip, and said data strobe signal line is not connected to said data strobe signal pad of the second memory chip.

4. A stacked semiconductor device comprising:

a data strobe signal line connected to a first data strobe signal pad of a first memory chip;

an inverted data strobe signal line connected to a second data strobe signal pad of a second memory chip, wherein the first and second memory chips each include a switching pad dedicated to a data strobe signal and an inverted data strobe signal, respectively, the first memory chip controls inputting/outputting of data signals with said data strobe signal by said first switching pad of the first memory chip being open or connected to a power supply, and the second memory chip inverts said inverted data strobe signal supplied from said second data strobe signal pad to form a data strobe signal by said second switching pad of said second memory chip being connected to ground, the second memory chip inverting a data strobe signal output from an internal circuit of said second memory chip to form an inverted data strobe signal.

5. The stacked semiconductor device according to claim 4 wherein said inverted data strobe signal pad of each of the first and second memory chips is not connected to said data strobe signal line nor to said inverted data strobe signal line.

6. A stacked semiconductor device comprising:

first and second memory chips, each including:

a clock driver that generates a clock signal;

a latch circuit that controls output of a data signal and a data strobe signal based on said clock signal; and a clock switch arranged in a wiring between said clock driver and a latch circuit, wherein said clock driver and said clock switch become conductive by said clock switch of the first memory chip being connected to a power supply, said clock driver and said latch circuit are disconnected from each other by said clock switch of the second memory chip being connected to ground, and said latch circuit of the first memory chip is connected to said latch circuit of the second memory chip via a wiring.

7. A stacked semiconductor device comprising:

first and second memory chips, each including:

a clock driver that generates a clock signal;

a first latch circuit that controls output of a data signal and a data strobe signal based on said clock signal;

a synchronizing circuit that outputs a data strobe signal from said first latch circuit of the first memory chip or a data strobe signal from said first latch circuit from the second memory chip, whichever is later in an input timing; and a second latch circuit that exercises output control of data signals from said first latch circuit based on a data strobe signal from said synchronizing circuit.

8. A device comprising:

a first set of data terminals;

a second set of data terminals;

a first strobe terminal provided for a first strobe signal; a second strobe terminal provided for a second strobe signal, the first strobe signal being complementary to the second strobe signal;

a first memory chip receiving or supplying a first set of data signals from or to the first set of data terminals in response to the first strobe signal, the first memory chip being free from being supplied with the second strobe signal; and a second memory chip receiving or supplying a second set of data signals from or to the second set of data terminals in response to the second strobe signal in parallel to the first memory chip receiving or supplying the first set of data signals, the second memory chip being free from being supplied with the first strobe signal.

9. The device according to claim 8, further comprising a controller coupled to the first set of data terminals, the second set of data terminals and first and second strobe terminals, the controller providing the first set of data signals, the second set of data signals and the first and second strobe signals respectively to the first set of data terminals, the second set of data terminals and first and second strobe terminals while the first memory chip and the second memory chip are receiving the first set of data signals and the second set of data signals from the first set of data terminals and the second set of data terminals, respectively.

10. The device according to claim 9, wherein the controller receives the first set of data signals, the second set of data signals and the first and second strobe signals respectively from the first set of data terminals, the second set of data terminals and first and second strobe terminals while the first memory chip and the second memory chip are supplying the first set of data signals and the second set of data signals to the first set of data terminals and the second set of data terminals, respectively.

11. The device according to claim 8, wherein the first and second memory chips are stacked with each other.

* * * * *